United States Patent [19]

Cory et al.

[11] Patent Number: 5,227,724
[45] Date of Patent: Jul. 13, 1993

[54] PULSED-GRADIENT SPIN DIFFUSION NMR METHOD

[75] Inventors: David G. Cory, Billerica, Mass.; Joel B. Miller, Cheverly; Allen N. Garroway, Fort Washington, both of Md.

[73] Assignee: The United States of America as represented by the Secretary of the Navy, Washington, D.C.

[21] Appl. No.: 710,848

[22] Filed: Jun. 6, 1991

[51] Int. Cl.$^5$ ............................................. G01V 3/00
[52] U.S. Cl. .................................... 324/307; 324/309; 324/306; 128/653.3
[58] Field of Search ............... 324/300, 306, 307, 309; 128/653.2, 653.3

[56] References Cited

U.S. PATENT DOCUMENTS

| | | | |
|---|---|---|---|
| 4,714,884 | 12/1987 | Glover | 324/309 |
| 4,743,851 | 5/1988 | Lim et al. | 324/309 |
| 4,780,674 | 10/1988 | Breton et al. | 324/309 |
| 4,812,760 | 3/1989 | Bottomley et al. | 324/309 |
| 5,125,407 | 6/1992 | Harms et al. | 324/309 |
| 5,133,357 | 7/1992 | Dumoulin et al. | 324/309 |

Primary Examiner—Louis Arana
Attorney, Agent, or Firm—Thomas E. McDonnell; Barry A. Edelberg

[57] ABSTRACT

A method is provided for measuring the distribution of the extent of molecular transport along two orthogonal directions, and further for measuring the anisotropy of molecular transport. For a sample which consists of compartments which contain mobile spins, such as round or cylindrical micelles, the distribution of compartment eccentricities can be calculated from this measurement. This method enables the anisotropy of molecular transport to be determined for a sample independently of any bulk orientation within the sample and thus the anisotropy of local geometries can be determined.

16 Claims, 1 Drawing Sheet

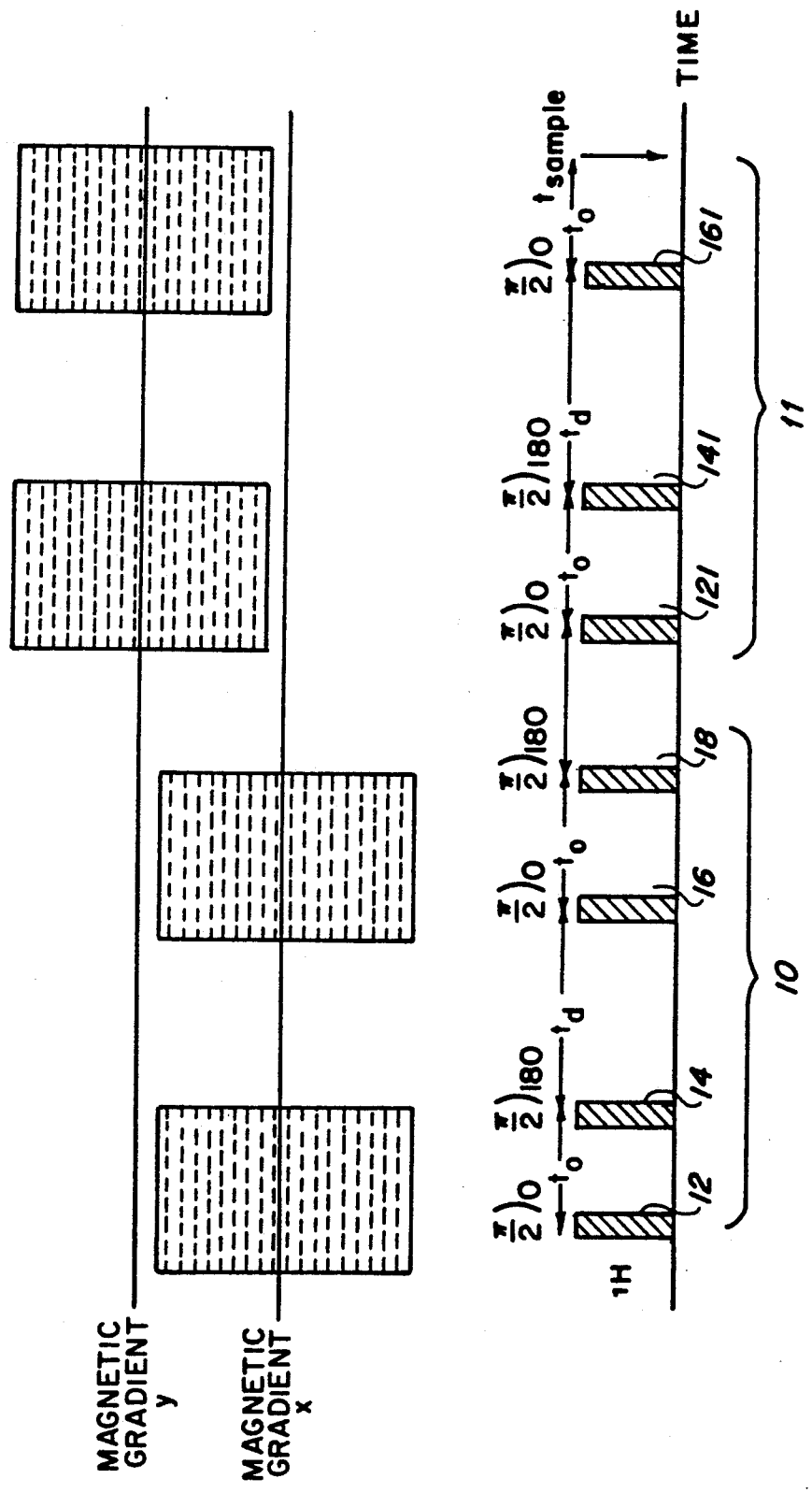

PULSED-GRADIENT SPIN DIFFUSION NMR METHOD

FIELD OF THE INVENTION

The invention is directed to nuclear magnetic resonance (NMR) methods, and in particular to pulsed-gradient spin-diffusion methods for measuring the extent of molecular transport in two orthogonal directions and for measuring the local anisotropy of spin mobility.

BACKGROUND OF THE INVENTION

Many materials contain small regions of mobile species confined to leaky compartments. Often the average spatial characteristics of such compartments are more interesting than their absolute spatial locations, but frequently the compartments are of a size that is difficult, or impossible, to study by NMR imaging. NMR methods may still be desirable, however, due to the wide range of relatively simple chemical selectivity offered. As discussed below, the present invention provides a method for characterizing local geometries based on spin transport inside and through leaky compartments as detected by pulsed-gradient spin-echo NMR experiments.

Pulsed-gradient spin-echo measurements are well-known methods of measuring molecular transport along one direction. A conventional pulse-gradient spin-echo experiment measures, using an observed echo magnetization, the convolution of the initial spin density with the conditional probability of molecular transport to a new position. Such an experiment is only sensitive to molecular transport along the direction of the applied magnetic field gradient.

More precisely, the observed echo magnetization, $S(g)$, has the form $$S(g) = \int p(\vec{r}_o) \int P(\vec{r}_o/\vec{r},t_d) \exp\{i\gamma t_{\text{eff}} \vec{g} \cdot (\vec{r}-\vec{r}_o)\} d\vec{r}\, d\vec{r}_o \quad (1)$$

where $p(\vec{r}_o)$ $\rho$initial concentration as a function of the initial position, $\vec{r}_o$, $P(\vec{r}_o/\vec{r},t_d)$ $\rho$conditional probability that a spin initially at $\vec{r}_o$ will diffuse to $\vec{r}$ after time $t_d$, $\gamma$ is the magnetogyric ratio, and g$\gamma$magnetic field gradient strength.

A displacement profile, $I(x)$, is obtained by taking a fourier transform of $S(g)$ with respect to the gradient strength:

$$I(x) = \int p(\vec{r}_o) P(\vec{r}_o/(\vec{r}_o+X),t_d)\, d\vec{r}. \quad (2)$$

Thus, $I(x)$ represents a measure of the number of spins which have moved a given amount, $x$, during $t_d$.

For an oriented sample, the gradient direction, $x$, can be varied in separate experiments to measure the bulk anisotropy of molecular mobility within the sample. However, for an un-oriented sample the bulk anisotropy of molecular mobility cannot be measured by this technique.

The pulsed-gradient spin-echo technique of the prior art provides a method for measuring the self-diffusion constant of mobile molecules, as well as the extent of molecular mobility where molecules are confined to impenetrable compartments. For a sample which is composed of compartments which have a uniform size, shape and orientation, the prior art method provides a measurement of the eccentricities of the compartments by comparing the extent of molecular transport along two orthogonal directions. However, in the absence of bulk orientation of the compartments within the sample, this measurement fails since, for randomly oriented compartments, a bulk measurement of the extent of molecular 13 transport is independent of direction.

An example of a patented method using a pulsed-gradient spin-diffusion technique is disclosed in U.S. Pat. No. 4,780,674 (Breton et al).

SUMMARY OF THE INVENTION

In accordance with one aspect of the invention, a NMR pulsed-gradient spin-echo method provides two-dimensional excitation of nuclear spins of a sample for the measurement of the displacement profile of the nuclear spins of the sample in two directions. The method comprises applying to the sample a static magnetic field along a z-axis and further applying to said sample, in sequence: a first pulsed-gradient spin-echo pulse sub-sequence, having a pulsed-magnetic field gradient along a first axis, for encoding the extent of transport of the nuclear spins along the first axis, and a second pulsed-gradient spin-echo pulse sub-sequence, having a pulsed-magnetic field gradient along a second axis, for encoding the extent of transport of the spins along the second axis.

Preferably, the first pulsed-gradient spin-echo pulse subsequence further comprises, in sequence: a first pair of radiofrequency (rf) magnetic pulses for encoding the initial locations of the spins within the magnetic field gradient along the first axis a time interval $t_d$, during which time the magnetic gradient is deactivated, $t_d$ being sufficiently long such that the spins diffuse to new locations along the first axis and a second pair of rf magnetic pulses for encoding the difference between the initial and second locations of the spins.

In addition, the second pulsed-gradient spin-echo pulse subsequence preferably further comprises, in sequence: a first pair of rf magnetic pulses for encoding the locations of the spins within the magnetic field gradient along the second axis; a time interval $t_d$, during which time the magnetic gradient is deactivated, $t_d$ being sufficiently long such that the spins diffuse to new locations along the second axis; a second rf magnetic pulse for encoding the difference in locations of the spins.

In accordance with a further aspect of the invention, a pulsed-gradient spin-echo method is provided for measuring the local anisotropy of molecular transport of spins in a sample. The method comprises the steps of: i) determining the one-dimensional spin displacement of the sample, e.g., by conventional means, ii) applying a pulsed-gradient spin-echo pulse sub-sequence to the sample with the magnetic field gradient along a first axis to spatially encode the extent of spin transport along the first axis, iii) applying a pulsed-gradient spin-echo pulse sub-sequence to the sample with a magnetic field gradient along a second axis to spatially encode the extent of spin transport along the second axis, iv) measuring the sum of the extent of spin transport along the first and second axes, v) determining therefrom the cross-sectional area of spin displacement of the sample, and vi) comparing the one dimensional spin displacement and the cross-sectional area of spin displacement of the sample to thereby provide a measure of the anisotropy of molecular transport within the sample.

The invention allows the anisotropy of molecular transport to be measured in the absence of bulk orientation. For samples which contain compartments of mobile molecules this enables a simple measure of the distribution of compartment eccentricities to be made.

Other features and advantages of the invention will be set forth in, or be apparent from, the detailed description of the preferred embodiments which follows.

BRIEF DESCRIPTION OF THE DRAWINGS

The single figure in the drawings is a schematic representation of a pulsed-gradient spin-echo pulse sequence in accordance with a preferred embodiment of the invention.

DETAILED DESCRIPTION OF THE PREFERRED EMBODIMENT

With reference to the drawings, a preferred embodiment of the invention will now be described. As discussed above, the invention provides a pulsed-gradient spin-echo sequence for use in measuring the convolution of spin density with the product of molecular transport along two orthogonal directions.

As shown in the drawings, the pulse sequence of the invention includes two pulsed-gradient spin-echo sub-sequences, designated 10 and 11. Sub-sequence 10, which includes a magnetic field gradient applied along the x-axis, encodes the extent of spin transport along the x-axis. Sub-sequence 11, which includes a magnetic field gradient applied along the y-axis, encodes the extent of spin transport along the y-axis. A measurement of the spin magnetization of sample, taken at time $t_{sample}$, yields the sum of the spin transport along the x- and y-axes.

The nuclear spins of a compartmented sample are initially aligned along the z-axis, by conventional means such as a static magnet. Then a magnetic field gradient, of known strength, is produced along the x-axis, also by conventional means. A $\pi/2)_o$ rf field pulse 12 of magnitude $B_1$ is applied to the sample to reorient the spins from the z-axis to the transverse (or x-y) plane which is perpendicular to the z-axis. The subscript O on the rf pulse indicates an arbitrary rf phase, taken here as 0°.

The presence of the magnetic field gradient along the x-axis causes the spins to precess within the transverse plane through a precession angle $\theta$. The spin precession is commonly known as "spin evolution". The time interval $t_e$, which follows pulse 12, provides time for the precession to occur and is known as the "spin evolution time." For a known $t_e$, the amount of precession is function of the strength of the magnetic field gradient applied along the x-axis so that spins located in an area of the magnetic gradient which is strong will precess more than spins located in an area of the magnetic gradient which is relatively weak. Since the magnetic gradient is applied only along the x-axis, the amount of precession directly relates to the location along the x-axis. Thus, the magnitude of precession angle $\theta$ corresponds to the location of the spin within the sample along the x-axis.

Thereafter, a $x/2)_{180} B_1$ rf magnetic pulse 14 is applied to the sample to halt the spin evolution by re-orienting the spins to the z-axis where the amount of precession during $t_e$ is preserved as spin phase angle $\theta$.

A time interval $t_d$, during which the magnetic gradient is turned off, follows the first pair of pulses 12 and 14, and provides sufficient time to allow spins to diffuse to new locations along the x-axis direction.

Again, a magnetic field gradient is applied along the x-axis, identical in field strength to the first gradient discussed above. A $\pi/2)_o B_1$ rf magnetic pulse 16 is applied to the sample to reorient the spins from the z-axis back to the transverse plane. Rf magnetic pulse 16 is identical to pulse 12 but effectively inverts the phase of the accumulated precession by returning magnetization to the xy plane as the complement of the angle $\theta$.

A further time interval $t_e$ follows pulse 16 and allows for spin evolution within the transverse plane in the presence of the gradient. Again, the amount of spin precession is a function of the location of the spin within the magnetic gradient along the x-axis. However, due to the phase inversion, the spin evolution following pulse 16 tends to cancel the spin evolution that follows pulse 12. For spins which do not diffuse during time $t_d$ the spin evolution will completely cancel yielding no net spin evolution and 16 therefore producing no net change in the total spin magnetization of the sample. However, for spins which diffuse along the x-axis during time $t_d$ the spin evolution following pulse 16 does not 19 cancel the spin evolution following pulse 12. Total cancellation does not occur because the spin has moved to a new location within the magnetic gradient where it encounters a different magnetic field strength, and thus precesses by an amount different from first precession angle $\theta$.

Next, a $\pi/2)_{180} B_1$ rf magnetic pulse 18 re-orients the spins to the z-axis and thereby preserves the net precession angle— corresponding to the amount of movement along the x-axis.

A measurement of the total spin magnetization taken just before pulse 18 would yield a measure of the amount of molecular diffusion along the x-axis. However, the method of the present invention includes the sub-sequence 11 which also encodes the amount spin transport along the y-axis such that the sum of the spin transport along the x- and y-axes is ultimately measured.

As shown in the drawings, sub-sequence 11 is similar to subsequence 10 with like pulses being identified by like references numerals with primes attached. However, in sub-sequence 11 the magnetic field gradient is applied along the y-axis. Thus the amount of spin precession occurring during time periods $t_e$ corresponds to locations of the spins along the y-axis thus yielding a measure of the amount of spin transport along the y-axis. Sub-sequence 11 does not include a final pulse corresponding to pulse 18, as it is not necessary to finally re-orient the spin to the z-axis. Rather, the spin magnetization of the compartment samples is measured immediately at the end of the final spin evolution time period $t_e$.

The generation of the various rf magnetic pulses, the generation of the pulsed-gradient magnetic field, and the final measurement of the total spin magnetization of the sample are all conventional and hence will not be further described. From the preceding discussion it is clear that only the component of the magnetization perpendicular to the rf field axis is recovered; to recover both parallel and perpendicular components of the magnetization, the experiment is repeated but with rf pulses whose phase has been altered by 90°. Similarly, those skilled in the art will recognize the advantage of additional cycling of the rf phases in order to remove artifacts created by experimental imperfections. These well-known embellishments will not be further discussed.

Thus far the basic pulse sequence of the invention has been described. Next, a method for using the pulse sequence of the invention to measure the local spin anisotropy of spin mobility will be described.

Generally, the two-dimensional spin-echo displacement profile is:

$$\Gamma(x,y) = \int p(\vec{r}_o) P(\vec{r}_o/(\vec{r}_o+x), t_d) P(\vec{r}_o/(\vec{r}_o+y), t_d) \, d\vec{r}. \quad (3)$$

with similiar definitions as in Eq. (1).

Since the convolution of the spin density and the product of the molecular transport is carried out separately for each spin, the measured quantity represents the distribution of the crosssectional areas in which the molecules are free to move. Thus, the simple ratio of a cross-sectional area of spin displacement, $I'(x,y)$, to a one-dimensional spin displacement, $I(x)$, yields a measure of the anisotropy of molecular transport within a sample.

A measurement of the cross-sectional spin displacement is accomplished by using the NMR pulse sequence shown in the drawings. As described above, the first half of the pulse sequence encodes the extent of spin transport along the x-axis during $t_d$. The second half of the pulse sequence encodes the extent of spin transport along the y-axis during $t_d$. The observed evolution is the cumulative effects of these two periods.

The addition of the two phase evolutions (i.e. spin transport along x and then the spin transport along y) are carried out for each spin individually, according to the pulse sequence of the drawings. The response according to equation (3) above is observed, and the anisotropy of spin transport is thereby measured.

Thus the distribution of the local anisotropies of molecular mobilities is measured rather than the average anisotropy of the bulk molecular mobility measured by prior methods.

In particular, the displacement profile above measures the internal length of compartments along the direction of the applied gradient. A prior art pulse sequence for randomly oriented compartments measures a superposition of the internal lengths, but does not reveal anything of the two-dimensional geometry of the compartment.

However, with the pulse sequence of the invention, by recording a displacement profile (which is the sum of spin transport along two orthogonal axes), and comparing this to the displacement profile recorded for one axis alone, a simple measure of the compartment eccentricity is achieved.

If the compartment is spherical, then the profile obtained from two orthogonal directions will be twice as broad as that obtained from only one direction, and thus the ratio of the one-dimensional spin displacement to the cross-sectional area of spin displacement will be 2. For an ellipsoid, however, the ratio will be less than 2 and will approach 1 for infinitely long cylinders.

Thus by evaluating the ratio of the cross-sectional ratio of spin displacement to the one dimensional spin displacement one determines the anisotropy of the compartments.

The pulse-gradient spin-echo sequence discussed above is one of a family of echoes capable of providing a measurement of the local anisotropies of spin mobilities. Any echo sequence is suitable as long as the sequence provides for the summation of spin displacements along two orthogonal directions and that summation is determined separately for each individual compartment.

Although the invention has been described with respect to exemplary embodiments thereof, it will be understood by those skilled in the art that variations and modifications can be effected in these exemplary embodiments without departing from the scope and spirit of the invention.

What is claimed:

1. A NMR method for providing two-dimensional excitation of the nuclear spins of a sample, said method comprising applying to said sample a static magnetic field along a z-axis and further applying to said sample, in sequence:
   a first pulsed-gradient spin-echo pulse sub-sequence, having a pulsed magnetic field gradient along a first axis, for encoding the extend of transport of said nuclear spins along said first axis, and
   a second pulsed-gradient spin-echo pulse sub-sequence, having a magnetic field gradient along a second axis, for encoding the extend of transport of said spins along said second axis.

2. The method of claim 1, wherein said first and second axes are orthogonal.

3. The method of claim 1, wherein said first pulsed-gradient spin-echo pulse sub-sequence further comprises, in sequence:
   a first pair of rf magnetic pulses for encoding the initial locations of said spins within said magnetic field gradient along said first axis,
   a time interval $t_d$, during which said magnetic gradient is deactivated, of sufficient duration such that said spins diffuse to new locations along said first axis,
   a second pair of rf magnetic pulses for encoding said new locations of said spins.

4. The method of claim 1, wherein said second pulsed-gradient spin-echo pulse sub-sequence further comprises, in sequence:
   a first pair of rf magnetic pulses for encoding the locations of said spins within said magnetic field gradient of said second axis,
   a time interval $t_d$, during which said magnetic gradient is deactivated, of sufficient duration such that said spins diffuse to new locations along said second axis,
   a second rf magnetic pulse for encoding said new locations of said spins.

5. The method of claim 1, wherein said z-axis is perpendicular to said first and second axes.

6. The method of claim 1, wherein said first axis is parallel to said z-axis.

7. The method o claim 1, wherein said second axis is parallel to said z-axis.

8. The method of claim 1, wherein said first subsequence further comprises, in sequence:
   a first $\pi/2)_o$ $B_1$ magnetic rf pulse for re-orienting said spins from said z-axis is a transverse plane perpendicular to said z-axis,
   a time interval $t_e$ to allow for spin evolution within said transverse plane,
   a first $\pi/2)_{180}$ $B_1$ rf magnetic pulse for re-orienting said spins to said z-axis to encode the locations of said spins within said magnetic field gradient of said first axis,
   a time interval $t_d$, during which said magnetic gradient is deactivated, of sufficient duration such that said spins diffuse to new locations along said first axis,
   a second $\pi/2)_o B_1$ rf magnetic pulse for re-orienting said spins from said z-axis to said transverse plane with a phase inversion with respect to said first $\pi/2)_o$ $B_1$ rf magnetic pulse, a timer interval $t_e$ to allow for spin evolution within said transverse plane, a second $\pi/2)_{180}$ $B_1$ rf magnetic pulse for re-orienting said spins to said z-axis to encode said new locations of said spins within said magnetic gradient of said first axis, wherein $\pi/2)_O$ denotes a pulse with a nutation angel of $\pi/2$ and a phase of 0 degrees, and $\pi/2)_{180}$ denotes a pulse with a nutation angle of $\pi/2$ and a phase of 180 degrees.

9. The method of claim 1, wherein said second pulsed-gradient spin-echo pulse sub-sequence further comprises, in sequence:

a first $\pi/2)_O$ $B_1$ rf magnetic pulse for re-orienting said spins from said z-axis to a transverse plane perpendicular to said z-axis, a time interval $t_e$ to allow for spin evolution within said transverse plane, a first $\pi/2)_{180}$ $B_1$ rf magnetic pulse for re-orienting said spins to said z-axis to encode the locations of said spins within said magnetic gradient of said second axis, a time interval $t_d$, during which said magnetic gradient is deactivated, of sufficient duration such said spins diffuse to new locations along said second axis, a second $\pi/2)_O$ $B_1$ rf magnetic pulse of re-orienting said spins from said z-axis to said transverse plane with a phase inversion with respect to said first $\pi/2)_O$ $B_1$ rf magnetic pulse, and a time interval $t_e$ to allow for spin evolution within said transverse plane, wherein $\pi/2)_O$ denotes a pulse with a nutation angle of $\pi/2$ and a phase of 0 degrees, and $\pi/2)_{180}$ denotes a phase with a nutation angle of $\pi/2$ and a phase of 180 degrees.

10. A pulsed-gradient spin-echo method for measuring the local anisotropy of molecular transport of spins in a sample, said method comprising the steps of:

i) determining the one-dimensional spin displacement of said sample;

ii) applying a pulsed-gradient spin-echo pulse sub-sequence to said sample with said magnetic field gradient along a first axis for spatially encoding the extent of spin transport along said first axis;

iii) applying a pulsed-gradient spin-echo pulse sub-sequence to said sample with a magnetic field gradient along a second axis for spatially encoding the extent of spin transport along said second axis;

iv) measuring the sum of the extent of spin transport along said first and second axes;

v) determining therefrom the cross-sectional area of spin displacement of said sample;

vi) comparing said one dimensional spin displacement and said cross-sectional area of spin displacement of said sample to thereby provide a measure of the anisotropy of molecular transport within said sample.

11. The method of claim 10, wherein said step ii further comprises the steps of, applying a first pair of rf magnetic pulses for encoding the locations of said spins within said magnetic field gradient of said first axis, waiting a time interval $t_d$, during which said magnetic gradient is deactivated, with $t_d$ sufficiently long such that said spins diffuse to new locations along said first axis, applying a second pair of rf magnetic pulses for encoding said 12. The method of claim 10, wherein said step iii further comprises the steps of, applying a first pair of rf magnetic pulses for encoding the locations of said spins within said magnetic field gradient of said second axis, waiting a time interval $t_d$, during which said magnetic gradient is deactivated, with $t_d$ sufficiently long such that said spins diffuse to new locations along said second axis, applying a second rf magnetic pulse for encoding said new locations of said spins.

13. The method of claim 10, wherein said step ii further comprises the steps of, aligning said spins along a z-axis perpendicular to said first and second axes, applying a first $\pi/2)_O B_1$ rf magnetic pulse for re-orienting said spins from said z-axis to a transfer plane perpendicular to said z-axis, waiting a time interval $t_e$ to allow for spin evolution within said transverse plane, applying a first $\pi/2)_{180} B_1$ rf magnetic pulse for re-orienting said spins to said z-axis to encode the locations of said spins within said magnetic field gradient of said first axis, waiting a time interval $t_d$, during which said magnetic gradient is deactivated, with $t_d$ sufficiently long such that said spins diffuse to new locations along said first axis, applying a second $\pi/2)_O B_1$ rf magnetic pulse for re-orienting said spins from said z-axis to said transverse plane with a phase inversion with respect to said first $\pi/2)_O B_1$ rf magnetic pulse, waiting a time interval $t_e$ to allow for spin evolution within said transverse plane, applying a second $\pi/2)_{180} B_1$ rf magnetic pulse for re-orienting said spins to said z-axis to encode said new locations of said spins within said magnetic gradient of said first axis, wherein $\pi/2)_O$ denotes a pulse with a nutation angle of $\pi/2$ and a phase of 0 degrees, and $\pi/2)_{180}$ denotes a pulse with a nutation angle of $\pi/2$ and a phase of 180 degrees.

14. The method of claim 10, wherein said step iii further comprises the steps of, aligning said spins along a z-axis perpendicular to said first and second axes, applying a first $\pi/2)_O B_1$ rf magnetic pulse for reorienting said spins from said z-axis to a transverse plane perpendicular to said z-axis, waiting a time interval $t_e$ to allow for spin evolution within said transverse plane, applying a first $\pi/2)_{180} B_1$ rf magnetic pulse for re-orienting said spins to said z-axis to encode the locations of said spins within said magnetic field gradient to said second axis, waiting a time interval $t_d$, during which said magnetic gradient is deactivated, with $t_d$ sufficiently long such that said spins diffuse to new locations along said second axis, applying a second $\pi/2)_O B_1$ rf magnetic pulse for re-orienting said spins from said z-axis to said transverse plane with a phase inversion with respect to said first $\pi/2)_O B_1$ rf magnetic pulse, waiting a time interval $t_e$ to allow for spin evolution within said transverse plane, applying a second $\pi/2)_{180}$ $B_1$ rf magnetic pulse for re-orienting said spins to said z-axis to encode said new locations of said spins within said magnetic gradient of said second axis, wherein $\pi/d)_O$ denotes a pulse with a nutation angle of $\pi/2$ and a phase of 0 degrees, and $\pi/2)_{180}$ denotes a pulse with a nutation angle of $\pi/2$ and a phase of 180 degrees.

15. The method of claim 10, wherein said one-dimensional spin displacement of said sample is represented by the equation:

$$\Gamma(x,y) = \int p(\vec{r}_o) P(\vec{r}_o/(\vec{r}_o+x),t_d) P(\vec{r}_o/(\vec{r}_o+y),t_d) \, d\vec{r},$$

where
$p(\vec{r}_o)$ = initial concentration as a function of the initial position, $\vec{r}_o$, $P(\vec{r}_o/r,t_d)$ = conditional probability that a spin initially at $\vec{r}_o$ will diffuse to $\vec{r}_o+x$ or $\vec{r}_o+y$ after time $t_d$, and x represents said first axis and y represents said second axis.

16. The method of claim 10, wherein said cross-sectional area of spin displacement of said sample is represented by the equation:

$$\Gamma(x,y) = \int p(\vec{r}_o) P(\vec{r}_o/(\vec{r}_o+x),t_d) P(\vec{r}_o/(\vec{r}_o+y),t_d) \, d\vec{r}$$

where
$p(\vec{r}_o)$ = initial concentration as a function of the initial position, $\vec{r}_o$, $P(\vec{r}_o/r,t_d)$ = conditional probability that a spin initially at $\vec{r}_o$ will diffuse to $\vec{r}_o+x$ or $\vec{r}_o+y$ after time $t_d$, and x represents said first axis and y represents said second axis.

* * * * *